United States Patent
Reitinger

(10) Patent No.: US 9,177,845 B2
(45) Date of Patent: Nov. 3, 2015

(54) METHOD AND APPARATUS FOR THERMALLY PROCESSING PLASTIC DISCS, IN PARTICULAR MOULD WAFERS

(75) Inventor: Erich Reitinger, Emmering (DE)

(73) Assignee: ERS Electronic GMBH, Germering (DE)

( * ) Notice: Subject to any disclaimer, the term of this patent is extended or adjusted under 35 U.S.C. 154(b) by 1140 days.

(21) Appl. No.: 13/058,816

(22) PCT Filed: Aug. 6, 2009

(86) PCT No.: PCT/EP2009/060230
§ 371 (c)(1),
(2), (4) Date: Apr. 21, 2011

(87) PCT Pub. No.: WO2010/018125
PCT Pub. Date: Feb. 18, 2010

(65) Prior Publication Data
US 2012/0107757 A1  May 3, 2012

(30) Foreign Application Priority Data

Aug. 13, 2008 (DE) .......................... 10 2008 041 250

(51) Int. Cl.
*F27D 15/02* (2006.01)
*H01L 21/00* (2006.01)
*H01L 21/304* (2006.01)
*H01L 21/30* (2006.01)
(Continued)

(52) U.S. Cl.
CPC .... *H01L 21/67784* (2013.01); *H01L 21/67109* (2013.01); *H01L 21/6838* (2013.01)

(58) Field of Classification Search
None
See application file for complete search history.

(56) References Cited

U.S. PATENT DOCUMENTS

RE17,739 E  * 7/1930 Martin .......................... 264/257
4,659,400 A  4/1987  Garbis et al.
(Continued)

FOREIGN PATENT DOCUMENTS

EP  1189264  3/2002
EP  1523030  4/2005
(Continued)

OTHER PUBLICATIONS

International Search Report, corresponding to PCT Application No. PCT/EP2009/060230, mailed Nov. 16, 2009 (German and English language documents) (6 pages).
(Continued)

*Primary Examiner* — Gregory Huson
*Assistant Examiner* — Eric Gorman
(74) *Attorney, Agent, or Firm* — Maginot, Moore & Beck, LLP

(57) ABSTRACT

A method and apparatus for thermally processing mold wafers The method comprises: clamping a mold wafer at a first temperature on a first clamping device, the first temperature being below the hardening temperature of the plastic of the mold wafer; heating the mold wafer to a second temperature, which is higher than the first temperature and is above the hardening temperature; ending the clamping on the first clamping device and transporting the mold wafer heated to the second temperature to a second clamping device substantially contactlessly; clamping the heated mold wafer on the second clamping device; cooling the mold wafer down to a third temperature, which is lower than the second temperature and is below the hardening temperature; and ending the clamping on the second clamping device.

11 Claims, 9 Drawing Sheets

(51) Int. Cl.
*H01L 21/46* (2006.01)
*H01L 21/68* (2006.01)
*H01L 21/677* (2006.01)
*H01L 21/67* (2006.01)
*H01L 21/683* (2006.01)

(56) References Cited

U.S. PATENT DOCUMENTS

| | | | | |
|---|---|---|---|---|
| 5,518,542 | A | * | 5/1996 | Matsukawa et al. ............ 118/52 |
| 5,686,143 | A | * | 11/1997 | Matsukawa et al. .......... 427/271 |
| 5,723,154 | A | * | 3/1998 | Irie et al. ..................... 425/34.1 |
| 5,796,486 | A | | 8/1998 | Jacob |
| 7,780,438 | B2 | * | 8/2010 | Hayashi et al. ................. 432/81 |
| 7,871,265 | B2 | * | 1/2011 | Fukuoka et al. ................ 432/81 |
| 8,138,456 | B2 | * | 3/2012 | Fukuda et al. ............... 219/497 |
| 2002/0036977 | A1 | * | 3/2002 | Lenssen et al. ............... 369/273 |
| 2002/0167781 | A1 | * | 11/2002 | Matsuki et al. ............... 361/234 |
| 2004/0161548 | A1 | * | 8/2004 | Nagashima et al. .......... 427/558 |
| 2005/0074952 | A1 | * | 4/2005 | Miyamoto et al. ............ 438/455 |
| 2005/0085008 | A1 | * | 4/2005 | Derderian et al. ............ 438/106 |
| 2005/0167404 | A1 | | 8/2005 | Yamazaki |
| 2006/0005911 | A1 | * | 1/2006 | Kubo et al. ..................... 156/84 |
| 2006/0048177 | A1 | * | 3/2006 | Lenssen et al. ............... 720/718 |
| 2007/0160947 | A1 | | 7/2007 | Akimoto et al. |
| 2007/0207559 | A1 | * | 9/2007 | Hasebe et al. ................... 438/17 |
| 2007/0298188 | A1 | * | 12/2007 | Otsuka et al. ................. 427/487 |
| 2008/0047950 | A1 | | 2/2008 | Quach et al. |
| 2008/0105383 | A1 | * | 5/2008 | Kubo et al. ................... 156/494 |
| 2009/0115042 | A1 | * | 5/2009 | Koyanagi ...................... 257/686 |
| 2010/0290844 | A1 | * | 11/2010 | Voelk et al. ..................... 406/92 |
| 2011/0005899 | A1 | * | 1/2011 | Grzelak ..................... 198/471.1 |
| 2011/0049221 | A1 | * | 3/2011 | Blais et al. ................. 228/179.1 |
| 2011/0114623 | A1 | * | 5/2011 | Goodman et al. ............ 219/385 |
| 2011/0200952 | A1 | * | 8/2011 | Takiguchi et al. ............ 430/434 |
| 2013/0109192 | A1 | * | 5/2013 | Hawkins et al. .............. 438/758 |
| 2013/0213437 | A1 | * | 8/2013 | Ishii et al. ......................... 134/6 |
| 2014/0113156 | A1 | * | 4/2014 | Jonczyk et al. ............. 428/542.8 |

FOREIGN PATENT DOCUMENTS

| | | |
|---|---|---|
| GB | 2133757 | 8/1984 |
| JP | 57128940 | 8/1982 |
| JP | 59155141 | 9/1984 |
| WO | 0143168 | 6/2001 |

OTHER PUBLICATIONS

International Preliminary Examination Report under PCT Article 36, corresponding to PCT Application No. PCT/EP2009/060230, mailed Dec. 9, 2010 (German language document) (12 pages).

* cited by examiner

Fig. 1b
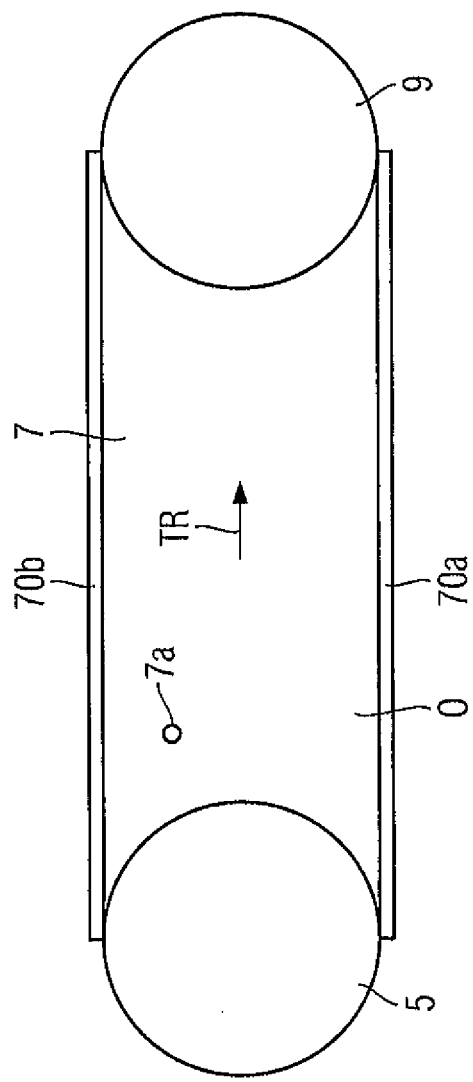
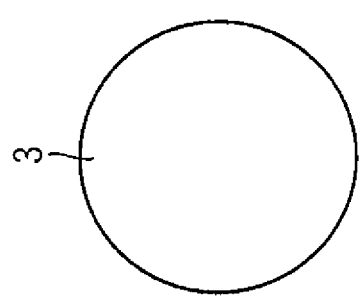

METHOD AND APPARATUS FOR THERMALLY PROCESSING PLASTIC DISCS, IN PARTICULAR MOULD WAFERS

This application is a 35 U.S.C. §371 National Stage Application of PCT/EP2009/060230, filed Aug. 6, 2009, which claims the benefit of priority to Serial No. 10 2008 041 250.3, filed Aug. 13, 2008 in Germany, the disclosures of which are incorporated herein by reference in their entirety.

The present invention relates to a method and an apparatus for thermally processing plastic discs, in particular mould wafers, which are also known as moulded wafers, synthetic wafers or epoxy wafers and are referred to throughout this text as mould wafers.

Although the present invention and the problems addressed by it are explained below on the basis of mould wafers, the invention is not restricted to these but can be applied generally to thin plastic discs.

In semiconductor technology, there has recently been an ever-increasing use of so-called mould wafers, in which individual silicon chips are embedded at a distance from one another in a moulding compound, the moulding compound itself having the form of a wafer and the silicon chips being, for example, set in place on a surface of the moulding compound.

In the course of the production of mould wafers, it is necessary to carry out thermal processing of a mould wafer assembly, comprising a thermally detachable film and a carrier substrate attached by said film to the mould wafer. To remove the carrier substrate and the film by dissolving the bonding adhesive, during this thermal processing the mould wafer is heated from one side by means of a clamping device (chuck) and subsequently cooled, which is explained in more detail below.

FIG. 9 shows an example of the dependence of the tensile strength Z of a plastics moulding compound of a mould wafer on the temperature T.

In FIG. 9, reference sign RT designates room temperature, for example 20° C., $T_H$ designates a hardening temperature, $T_W$ designates a softening temperature, UB designates a hard-soft transitional region, T1 designates a preheating temperature between room temperature RT and hardening temperature $T_H$ and T2 designates a temperature above the hardening temperature $T_H$ and below the softening temperature $T_W$. For example, $T_H$=140° C., T1=110° C., T2=180° C. and $T_W$=190° C.

For detachment, preheating to T1, further heating to T2, detachment at T2 and cooling down to RT are performed, for example. However, on account of the poor thermal conductivity of the plastic used for the mould wafer and the interaction with the embedded Si chips with a different coefficient of thermal expansion, this cooling leads in the transitional region UB to frozen-in stresses, resulting in bending (warping) of the mould wafer, which makes later handling and processing of the mould wafer more difficult or impossible.

It is an object of the present invention to provide a method and an apparatus for thermally processing plastic discs, in particular mould wafers, that allow thermal processing of plastic discs, in particular mould wafers, with which reduced or no bending occurs, or controllable deliberate bending, after the thermal processing.

The method according to the invention and the corresponding apparatus have the advantage that they allow thermal processing of thin plastic discs with no problems of bending (warping).

The concept on which the present first invention is based is that substantially contactless transportation of the heated plastic disc is carried out from the first clamping device to the second clamping device, for example by means of an air cushion, in order largely to avoid a thermal exchange. Controlled processing during cooling is then performed, so that no uncontrollable bending can occur.

Advantageous developments and improvements of the subject matter with which the invention is concerned can be found in the subclaims.

According to a preferred development, the contactless transportation of the heated plastic disc is carried out by means of a gas-cushion transporting device.

According to a further preferred development, the first clamping device, the second clamping device and the gas-cushion transporting device form a common planar surface.

According to a further preferred development, the contactless transportation of the heated plastic disc is carried out by means of a Bernoulli clamping device.

According to a further preferred element, the first clamping device has blasting nozzles directed in the transporting direction, by which the transportation is initiated.

According to a further preferred development, the first clamping device, the second clamping device and the gas-cushion transporting device are together tilted in the transporting direction, in order to initiate the transportation.

According to a further preferred development, the plastic disc is a mould wafer which is bonded to a carrier substrate at the first temperature by means of a thermally detachable film, the carrier substrate and the thermally detachable film being removed from the mould wafer at the second temperature.

According to a further preferred development, the plastic disc is placed onto the first clamping device by means of a third clamping device, the removal of the carrier substrate being carried out by lifting off by means of the third clamping device after thermal detachment of the film at the second temperature.

According to a further preferred development, the clamping on the first clamping device and/or the second clamping device is carried out by suction attachment by means of vacuum nozzles.

According to a further preferred development, the reaching of a predetermined end position of the plastic disc on the second clamping device is sensed by a sensor device, the clamping of the heated plastic disc on the second clamping device being triggered by a corresponding output signal of the sensor device.

According to a further preferred development, the plastic disc is connected to a transport plate, the plastic disc being clamped on the first clamping device and the second clamping device by means of the transport plate and the plastic disc being transported from the first clamping device to the second clamping device by means of the transport plate.

According to a further preferred development, the sensor device has a contactless optical sensor.

Exemplary embodiments of the invention are explained in more detail in the description which follows and are represented in the drawings, in which:

FIGS. 1a,b show schematic representations of an apparatus for the thermal delamination of mould wafers as a first embodiment of the invention, to be precise FIG. 1a in a side view and FIG. 1b in a plan view of the upper side;

In the figures, the same reference signs designate component parts that are the same or functionally the same.

Figure 1A:
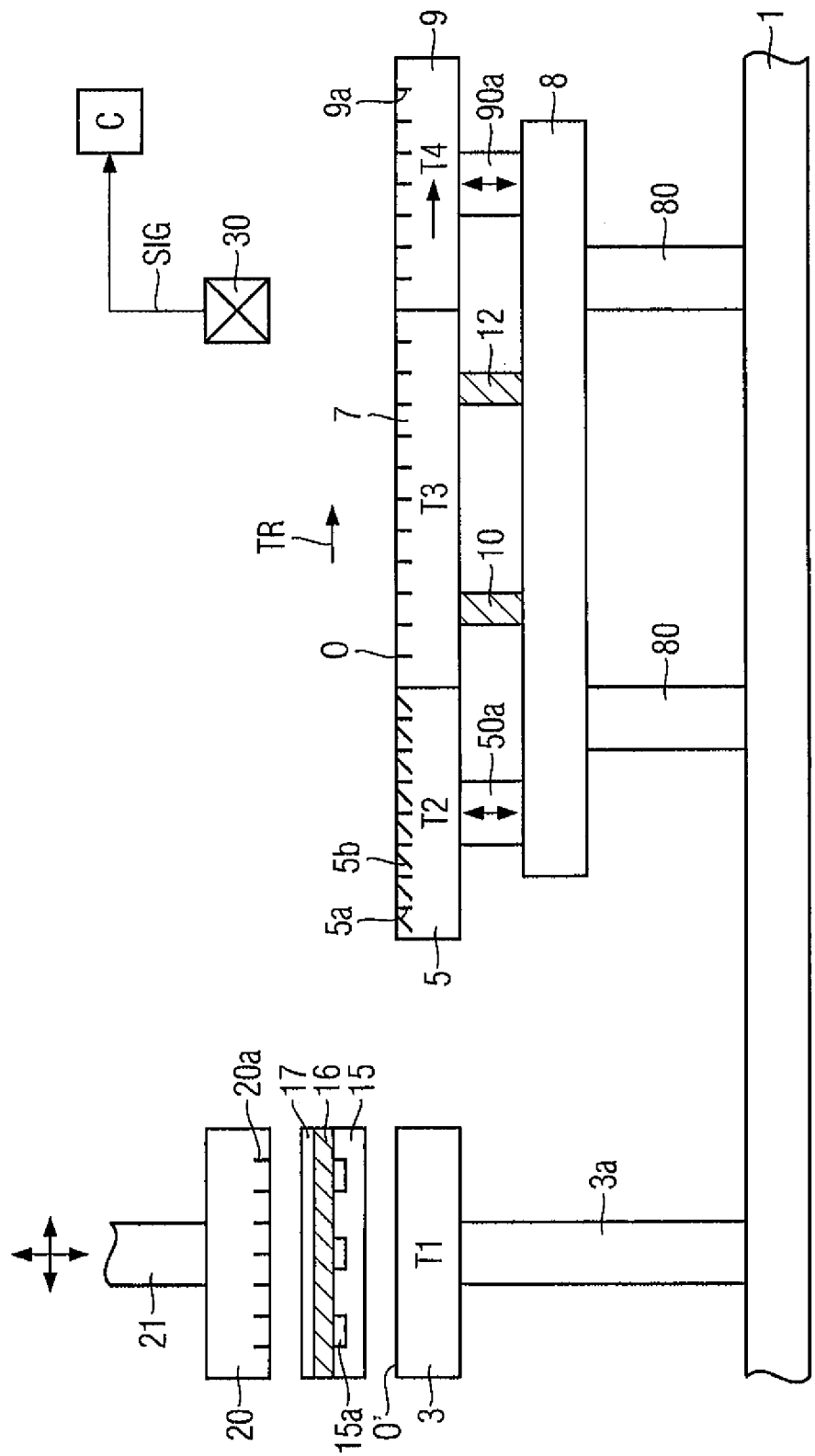

FIGS. 1a,b show schematic representations of an apparatus for the thermal delamination of mould wafers as a first embodiment of the invention, to be precise FIG. 1a in a side view and FIG. 1b in a plan view of the upper side.

In FIGS. 1a,b, reference sign 1 designates a base platform, which is produced for example from aluminium. A presentation platform 3 with an upper surface O' is attached on the platform 1 by means of a standing foot 3a. The presentation platform 3 is heatable and, in the case of the present example, is at the temperature T1=110° Celsius, corresponding to the example of FIG. 9. Reference sign 15 designates a mould wafer, embedded in which by a known method are silicon chips 15a, the one surface of which is flush with an upper side of the mould wafer 15. A carrier substrate 17, for example of steel, is bonded to the mould wafer by means of a thermally detachable film 16, which is a result of the production process of the mould wafer, in which the silicon chips 15a are placed on the thermally detachable film 16 and the encapsulation with plastics compound to form the mould wafer 15 in a corresponding form is subsequently performed.

Reference sign 20 designates a clamping device (chuck), which has vacuum nozzles 20a for clamping the mould wafer 15 as part of the assembly with the thermally detachable film and the carrier substrate 17. The clamping device 20 can be made to move three-dimensionally by means of a robot arm 21.

Also provided in the apparatus according to FIGS. 1a,b is a heatable clamping device 5, which is attached on a standing foot 50a, which is adjustable in height. The standing foot 50a is attached on a cross strut 8, which in turn rests on the base platform 1 by means of standing feet 80.

Figure 9:
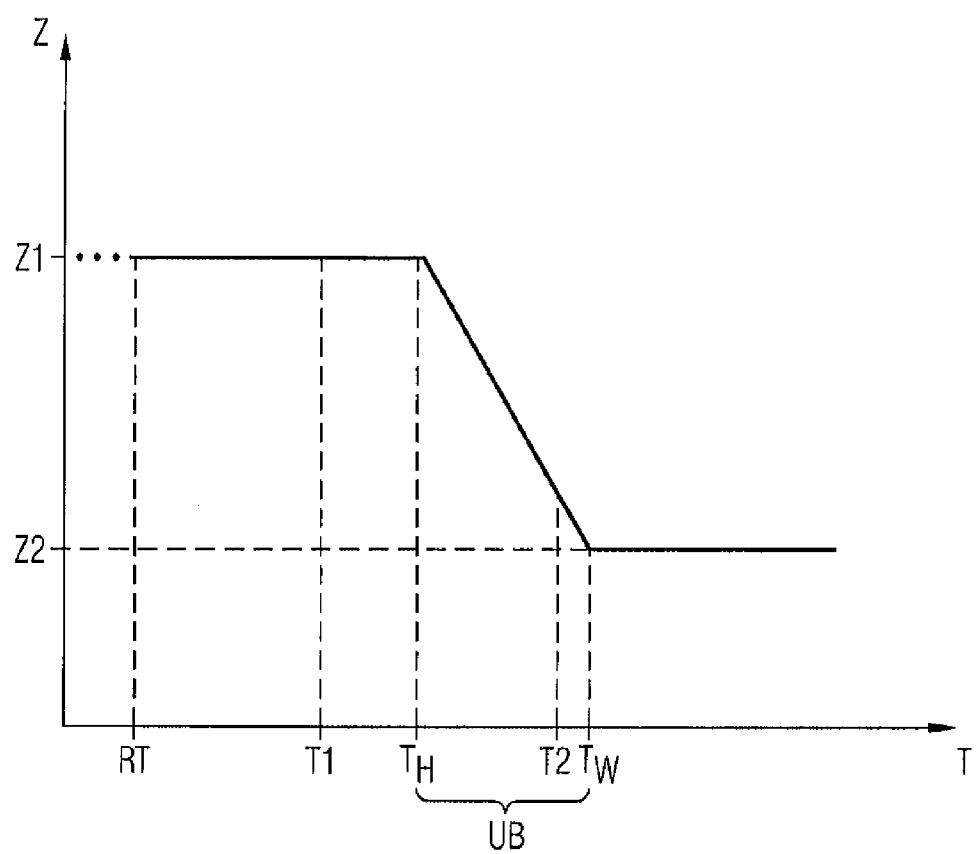
FIG. 9 shows an example of a dependence of the tensile strength Z of a plastics moulding compound of a mould wafer on the temperature T.

The clamping device 5 is at the temperature T2, corresponding to the example of FIG. 9, which is at 180° Celsius and is both above the hardening temperature $T_H$=140° C. of the plastic of the mould wafer and approximately at or above the decomposition temperature of an adhesive of the thermally detachable film 16.

Reference sign 5a designates vacuum nozzles of the clamping device 5, and reference sign 5b designates blasting nozzles of the clamping device 5 that are directed in a transporting direction TR and are explained in more detail later.

Directly adjacent to the clamping device 5, and forming a common planar surface O, are an air-cushion transporting device 7 and a further coolable clamping device 9. The air-cushion transporting device 7 has blasting nozzles 7a, which are suitable for the purpose of forming under the mould wafer 15 an air cushion at a temperature of T3=180° C. for the contactless transport from the clamping device 5 to the clamping device 9.

The coolable clamping device 9 likewise has vacuum nozzles 9a and is regulated to a temperature T4=20° Celsius (room temperature RT, corresponding to the example of FIG. 9), down to which the mould wafer 15 should be cooled at the end of the process sequence, which is described below. The standing foot 90a of the clamping device 9 is likewise adjustable in height.

On the thermally insulating standing feet 10, 12, the air-cushion transporting device 7 is attached on the cross strut 8. A construction of this kind makes it easily possible for the influence of different thermal expansions of the devices 5, 7, 9 to be counteracted or eliminated. That is to say, the devices 5 and 9 can be adjusted in height independently of one another in order to allow an adjustment of the common planar surface O.

As can be seen from FIG. 1b, attached to the sides of the air-cushion transporting device 7 are lateral guides 70a, 70b, which are intended to avoid slipping off sideways of a mould wafer 15 that is being contactlessly transported on said device.

Since the side edges of the mould wafer 15 become ever smaller in comparison with the lower and upper surfaces thereof, guidance of this kind does not influence contactless transportation of the mould wafer 15 on account of the hot-air cushion that is produced by the blasting nozzles 7a of the air-cushion transporting device 7. For reasons of overall clarity, only one blasting nozzle 7a is depicted in FIG. 1b.

Finally, reference sign 30 in FIG. 1a designates an optical sensor, which sends a signal SIG to a control device C, which controls the entire installation, in particular the transport of the mould wafer 15 and the thermal steps on the clamping devices 5, 9. In the present case, the sensor device 30 senses optically whether the mould wafer 15 transported from the clamping device 5 to the clamping device 9 by means of the air-cushion transporting device 7 is completely resting on the clamping device 9 in its end position, in response to which the suction attachment by means of the vacuum nozzles 9a of the clamping device 9 is initiated.

Figure 2:
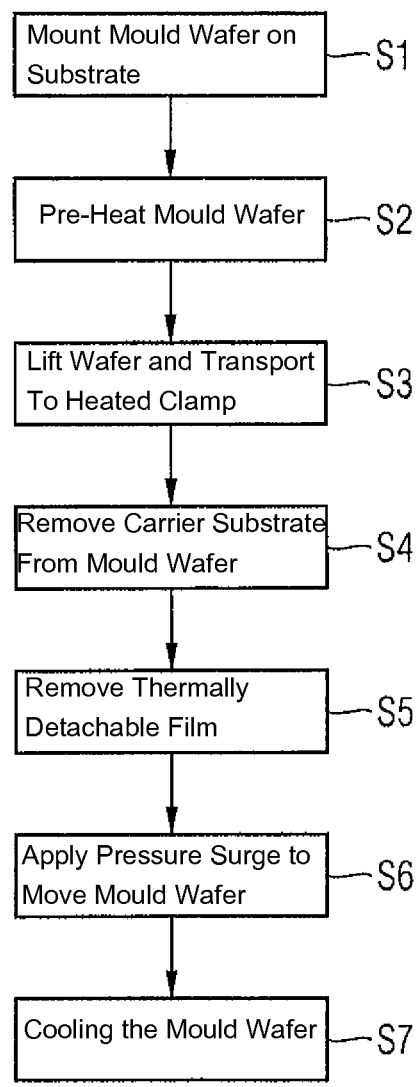
FIG. 2 shows a flow diagram to explain a method for the thermal delamination of mould wafers by means of the apparatus according to FIG. 1 as a second embodiment of the invention.

FIG. 2 is a flow diagram to explain a method for the thermal delamination of mould wafers by means of the apparatus according to FIG. 1 as a second embodiment of the invention.

It is assumed here that the plastic of the mould wafer has the temperature dependence of the tensile strength that is shown by way of example in FIG. 9.

In step S1, a mould wafer 15 as part of an assembly with the thermally detachable film 16 and the carrier substrate 17 is fetched by the clamping device 20 from a cartridge (not represented) and placed on the presentation platform 3 in such a way that the mould wafer 15 comes into contact with the upper surface O' thereof. In step S2, preheating of the mould wafer 15 to the temperature T1=110° Celsius is performed.

In the next step S3, the clamping device 20 lifts the mould wafer as part of the assembly with the thermally detachable film 16 and the carrier substrate 17, in the preheated state at about 110° Celsius, off the presentation platform 3 and transports it to the heatable clamping device 5, which is at a temperature T2=180° Celsius. The mould wafer 15 in the assembly is subsequently clamped on the clamping device 5 by means of the vacuum nozzles 5a thereof. At the same time, the clamping device 20 is likewise heated to 180° Celsius.

As soon as the adhesive of the thermally detachable film 16 has reached its delaminating temperature of 180° Celsius, the clamping device 20 is made to move upwards, and consequently the carrier substrate 17 is removed from the mould wafer, which takes place in step S4.

In step S5, the thermally detachable film 16 is removed from the upper surface of the mould wafer 15 by means of a suitable device (not shown).

In the following step S6, the suction attachment of the mould wafer 15, which is lying on the clamping device 5, is interrupted, and a pressure surge is applied to the blasting nozzles 5b, so that the mould wafer 15 experiences an initial pulse of movement in the transporting direction TR. The mould wafer 15 then glides contactlessly to the clamping device 9 by means of the air cushion of the air-cushion transporting device 7, not losing any significant amount of thermal energy to reach the clamping device 9, since the air stream of the air-cushion transporting device 7, which is preheated to the temperature T3=180° Celsius, prevents any heat losses.

When, at the end of step S6, the sensor device 30 senses that the mould wafer 15 is completely on the clamping device 9, suction attachment is automatically initiated there by means of the vacuum nozzles 9a, so that the mould wafer 15 is firmly clamped on the clamping device 9.

This is followed in step S7 by cooling of the mould wafer 15 from the temperature T2=180° Celsius down to the temperature T4=20° Celsius. On account of the controlled cooling process in the clamped state, it is possible to avoid bending of the mould wafer 15 during this thermal processing in the transitional region UB, corresponding to the example of FIG. 9.

After the mould wafer 15 has cooled down completely on the clamping device 9, it is transported by the clamping device 20 into a cartridge (not represented), the clamping device 20 having in the meantime already placed a following mould wafer 15 as part of an assembly onto the presentation platform 3 in order to save time in this way.

Figure 3:
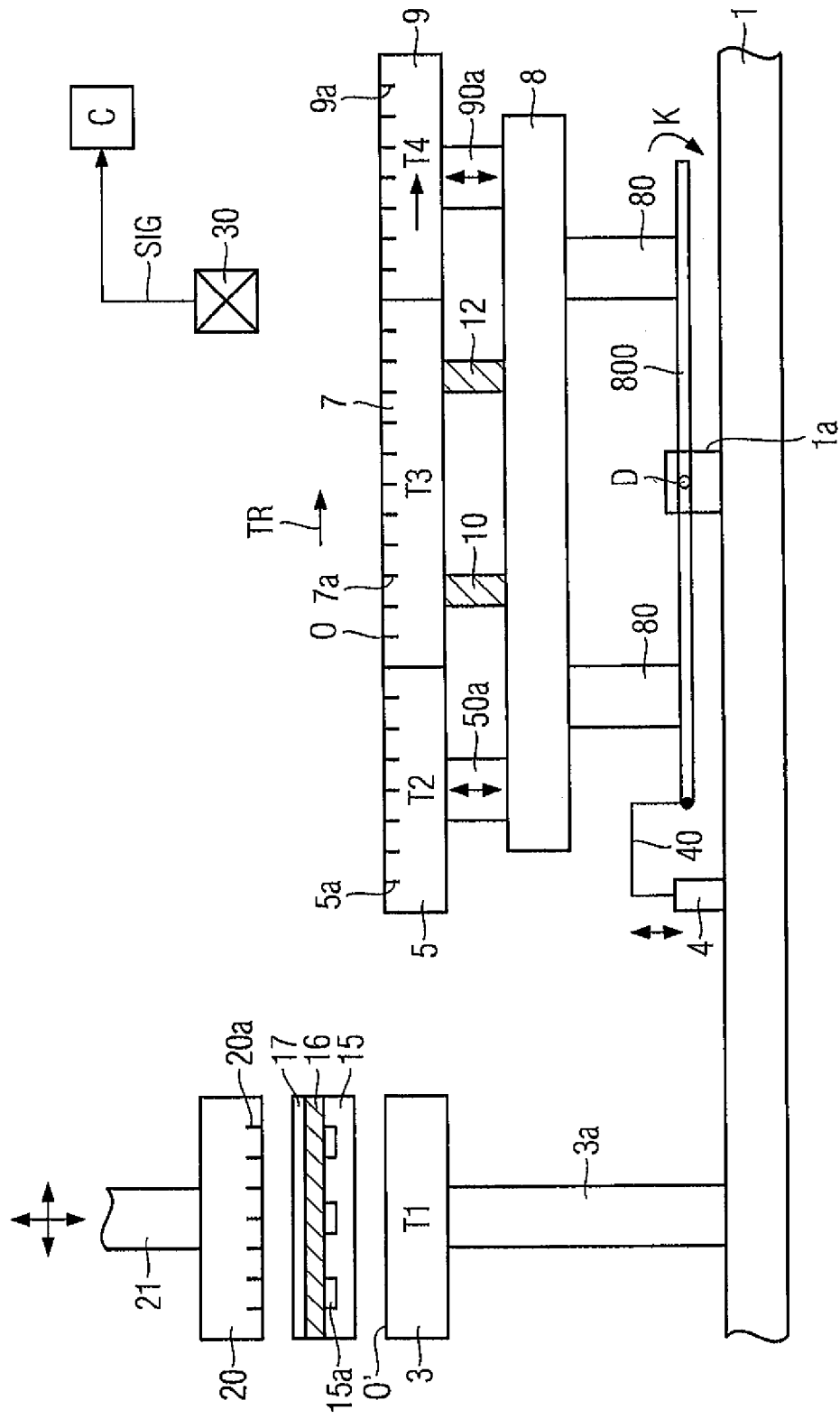
FIG. 3 shows a schematic side view of an apparatus for the thermal delamination of mould wafers as a third embodiment of the invention.

FIG. 3 shows a schematic side view of an apparatus for the thermal delamination of mould wafers as a third embodiment of the invention.

In the case of the third embodiment according to FIG. 3, the heatable clamping device 5 has no directed blasting nozzles 5b, but merely vacuum nozzles 5a. To initiate the transport of the mould wafer 15 from the clamping device 5 to the clamping device 9 by means of the air-cushion transporting device 7, the assembly comprising the clamping device 5, the air-cushion transporting device 7 and the clamping device 9 can be tilted about axis of rotation D in the transporting direction, which is indicated by an arrow K. Provided for this purpose is a further strut 800, which is rotatable about the axis of rotation D, the axis of rotation being provided at a stand 1a on the base platform 1. The standing feet 800 of the cross strut 8 rest in this example on the further strut 800.

Under the control of the control device C, the tilting movement is carried out by a linear actuator 4, which is connected to the further strut 800 by means of a thrust rod 40.

Figure 4:
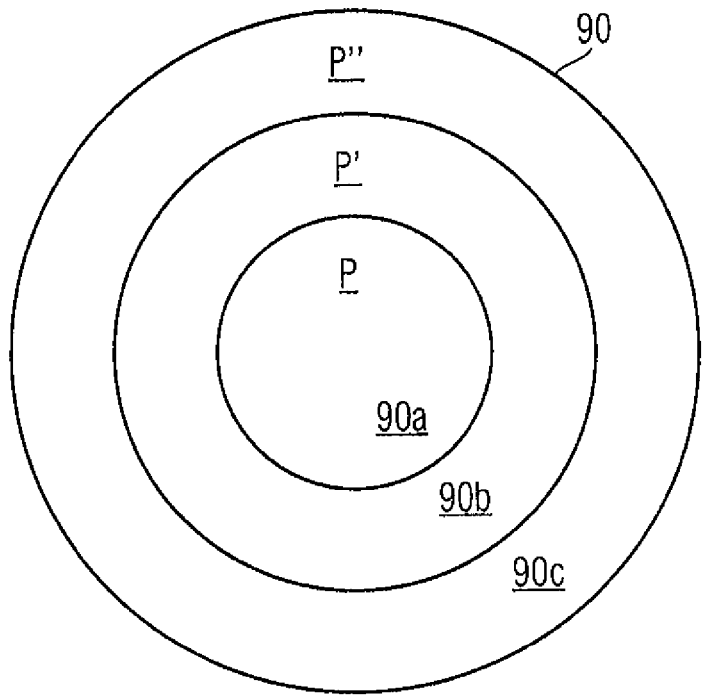
FIG. 4 shows a second clamping device for use in the case of a fourth embodiment of the invention.

FIG. 4 shows a second clamping device for use in the case of a fourth embodiment of the invention.

The coolable clamping device 90 used in the case of the fourth embodiment (corresponding to the clamping device 9 in the case of the first to third embodiments) has various suction-attachment circuits 90a, 90b and 90c, to which pressures P, P', P" can be applied independently of one another. This has the advantage that, in the case of a slight bending of the mould wafer after the transport by means of the air-cushion transporting device 7, the suction attachment and clamping by the clamping device 90 can be arranged in such a way that this slight bending is counteracted during solidification.

Figure 5:
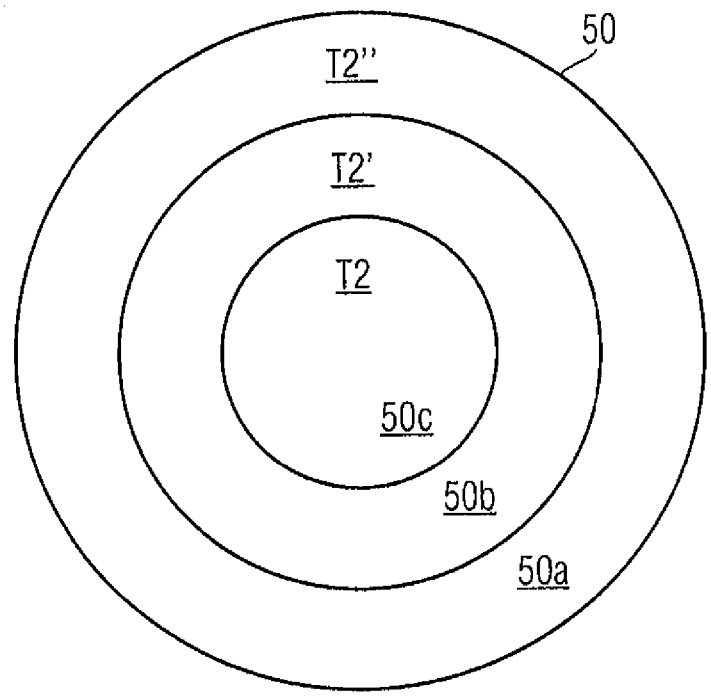
FIG. 5 shows a first clamping device for use in the case of a fifth embodiment of the invention.

FIG. 5 shows a first clamping device for use in the case of a fifth embodiment of the invention.

In the case of the fifth embodiment, the clamping device 50 (corresponding to the clamping device 5 in the case of the first to fourth embodiments) has three different heating circuits, which heat the regions 50a, 50b and 50c to corresponding temperatures T2, T2', T2". This zonal heating can also be used for the purpose of counteracting slight bending of the mould wafer 15 during cooling down.

Figure 6:
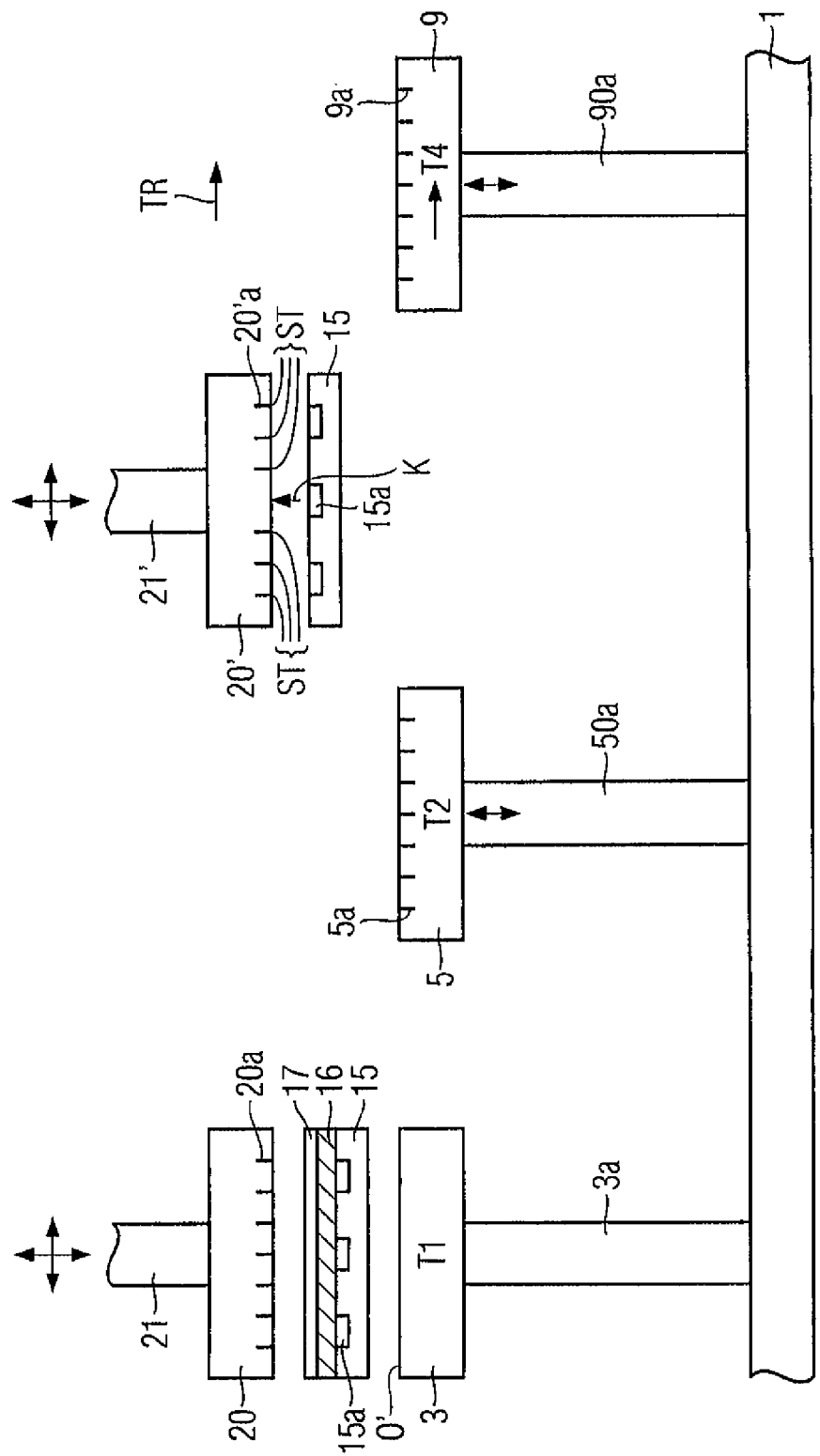
FIG. 6 shows a schematic side view of an apparatus for the thermal delamination of mould wafers as a sixth embodiment of the invention.

FIG. 6 shows a schematic side view of an apparatus for the thermal delamination of mould wafers as a sixth embodiment of the invention.

In the case of the sixth embodiment according to FIG. 6, no air-cushion transporting device 7 is provided for the substantially contactless transportation of the heated mould wafer 15 from the heatable clamping device to the coolable clamping device 9, but instead a Bernoulli clamping device 20', which is secured to a robot arm 21', which is three-dimensionally movable. The Bernoulli clamping device 20' has blasting nozzles 20a', by which a downwardly directed flow ST, set to a temperature of 180° C., can be produced between the mould wafer 15 and the surface thereof. The downwardly directed flow causes a force of attraction K in the central region, which has the effect that the mould wafer 15 can be contactlessly transported by the Bernoulli clamping device 20'.

Figure 7:
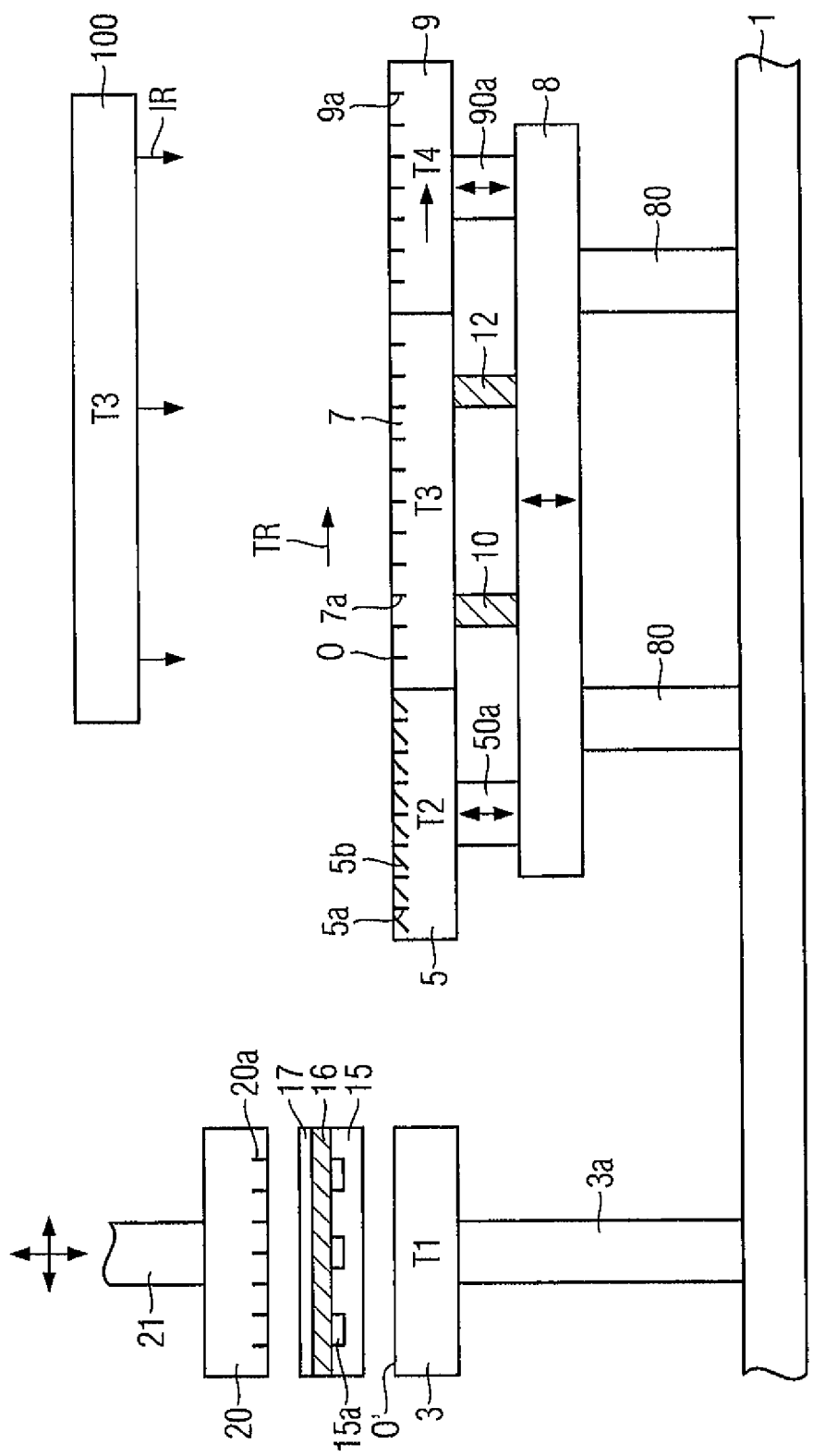
FIG. 7 shows a schematic side view of apparatus for the thermal delamination of mould wafers as a seventh embodiment of the invention.

FIG. 7 shows a schematic side view of an apparatus for the thermal delamination of mould wafers as a seventh embodiment of the invention.

In the case of the seventh embodiment according to FIG. 7, to ensure that the mould wafer 15 is transported from the clamping device 5 to the end position on the clamping device 9 without any heat loss, an additional infrared heating device 100 at a temperature T3=180° Celsius is provided above the air-cushion transporting device 7 and the clamping device 9. As soon as the cooling operation on the clamping device 9 begins, the infrared irradiation by the infrared heating device 100 is switched off or ramped down under process control.

Figure 8:
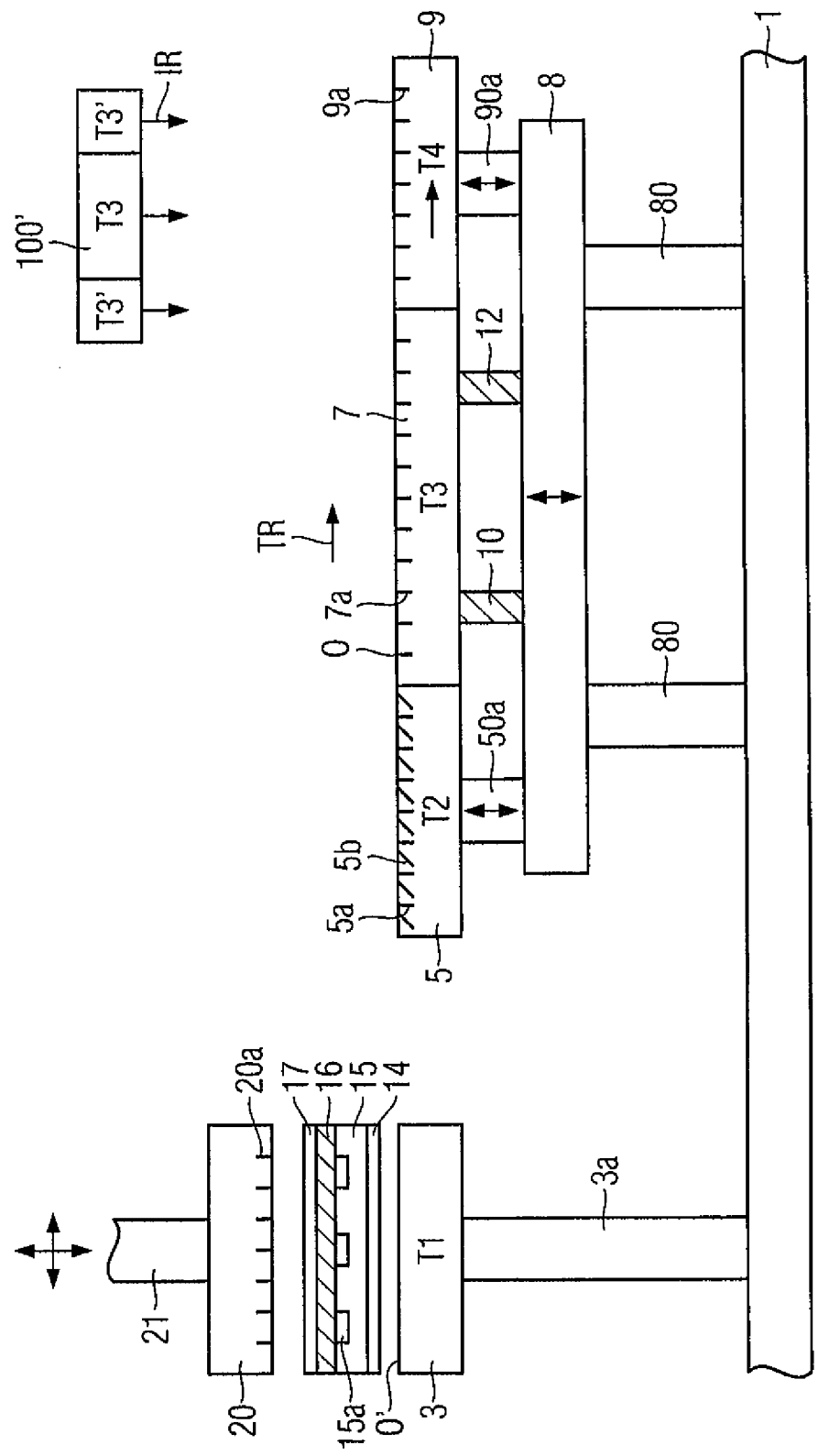
FIG. 8 shows a schematic side view of an apparatus for the thermal delamination of mould wafers as an eighth embodiment of the invention.

FIG. 8 shows a schematic side view of an apparatus for the thermal delamination of mould wafers as an eighth embodiment of the invention.

In the case of the eighth embodiment according to FIG. 8, an infrared heating device 100', which has separate irradiating regions that correspond to temperatures T 3=180° Celsius and T 3'=185° Celsius, is only provided above the clamping device 9. Irradiation of this kind of the upper side of the mould wafer 15, with subdivision into different segmental regions, likewise makes it possible to counteract any possible slight bending there may be.

Furthermore, in the case of the embodiment according to FIG. 8, a transport plate 14 is provided underneath the mould wafer 15, on the side thereof that is facing the clamping devices 5, 9, for example in the form of a further thin metal plate, which is particularly advantageous in the case of thin mould wafers. In this case, the clamping on the clamping device 5 or 9 is performed by means of the transport plate 14, and the transport from the clamping device 5 to the clamping device 9 by means of the air-cushion transporting device is also performed by means of the transport plate 14, after which cooling down takes place on the transport plate 14.

Although the present invention has been described above on the basis of preferred exemplary embodiments, it is not restricted to them but can be modified in various ways.

Although the present invention is explained above on the basis of mould wafers, the invention is not restricted to them but can be applied generally to thin plastic discs, which typically have a thickness of between 50 μm and 3 mm and a diameter of between 100 mm and 500 mm. In particular, the invention is also not restricted to round geometries of the plastic disc but can be applied to any desired geometries. The plastic discs may also be of a homogeneous or inhomogeneous structure.

Although in the case of the above embodiments either a gas-cushion transporting device or a Bernoulli clamping device has been used, it goes without saying that any contactless transporting device is suitable for use in the case of the invention. A further example of a contactless transporting device of this kind is an ultrasound transporting device. All that is important is that substantially contactless transport can be achieved without any appreciable heat loss of the mould wafers or the plastic disc.

Although a specific temperature dependency has been described in the above examples, the invention is not restricted to this but can be applied to plastic discs with any temperature dependence of the tensile strength.

Although the above embodiments are directed at largely avoiding the bending of the mould wafers, the invention may also be used for the purpose of bringing about deliberate bending under process control, for example in the range of a few degrees.

It goes without saying that the features of all the embodiments can also be combined with one another.

In the above embodiments, a series of two clamping devices has been described. It is likewise possible for such a series to have more than two clamping devices with further intermediate temperatures.

The invention claimed is:

1. A method for thermally processing mould wafers comprising the steps of:
    clamping a mould wafer at a first temperature on a first clamping device, the first temperature being below a hardening temperature of a plastic of the mould wafer, the mould wafer including silicon chips embedded in the plastic mould compound having a wafer shape;
    heating the mould wafer clamped on the first clamping device to a second temperature, which is higher than the first temperature and is above the hardening temperature;
    ending the clamping on the first clamping device and transporting the mould wafer heated to the second temperature from the first clamping device to a second clamping device substantially contactlessly;
    clamping the heated mould wafer on the second clamping device;
    cooling the mould wafer clamped on the second clamping device down to a third temperature, which is lower than the second temperature and is below the hardening temperature; and
    ending the clamping on the second clamping device,
    wherein the first and second clamping devices are configured to clamp the mould wafer against a surface of the corresponding clamping device to prevent bending of the mould wafer during heating and cooling of the mould wafer.

2. The method according to claim 1, the substantially contactless transportation of the heated mould wafer being carried out by a gas-cushion transporting device.

3. The method according to claim 2, the first clamping device, the second clamping device and the gas-cushion transporting device forming a common planar surface.

4. The method according to claim 1, the substantially contactless transportation of the heated mould wafer being carried out by a Bernoulli clamping device.

5. The method according to claim 1, the first clamping device having blasting nozzles directed in the transporting direction, by which the transportation is initiated.

6. The method according to claim 2, the first clamping device, the second clamping device and the gas-cushion transporting device being together tilted in the transporting direction, in order to initiate the transportation.

7. The method according to claim 1, the mould wafer being bonded to a carrier substrate at the first temperature by a thermally detachable film, and the carrier substrate and the thermally detachable film being removed from the mould wafer at the second temperature.

8. The method according to claim 7, the mould wafer being placed onto the first clamping device by means of a third clamping device and the removal of the carrier substrate being carried out by lifting off by the third clamping device after thermal detachment of the film at the second temperature.

9. The method according to claim 1, wherein at least one of the clamping on the first clamping device and the second clamping device is carried out by suction attachment by vacuum nozzles.

10. The method according to claim 1, the reaching of a predetermined end position of the mould wafer on the second clamping device being sensed by a sensor device and the clamping of the heated mould wafer on the second clamping device being triggered by a corresponding output signal of the sensor device.

11. The method according to claim 1, the mould wafer being connected to a transport plate and the mould wafer being clamped on the first clamping device and the second clamping device by the transport plate and the mould wafer being transported from the first clamping device to the second clamping device by the transport plate.

* * * * *